(12) United States Patent
Gansemer et al.

(10) Patent No.: US 11,515,583 B2
(45) Date of Patent: Nov. 29, 2022

(54) METHOD FOR DETERMINING THE STATE OF AN ELECTRICAL ENERGY STORAGE UNIT, CORRESPONDING DEVICE FOR CARRYING OUT THE METHOD AND CORRESPONDING ELECTRICAL ENERGY STORAGE UNIT

(71) Applicants: Robert Bosch GmbH, Stuttgart (DE); GS Yuasa International Ltd., Kyoto (JP)

(72) Inventors: Michael Gansemer, Kirchheim (DE); Christoph Woll, Gerlingen (DE)

(73) Assignees: Robert Bosch GmbH, Stuttgart (DE); GS Yuasa International Ltd., Kyoto (JP)

( * ) Notice: Subject to any disclaimer, the term of this patent is extended or adjusted under 35 U.S.C. 154(b) by 418 days.

(21) Appl. No.: 16/628,477

(22) PCT Filed: Jun. 29, 2018

(86) PCT No.: PCT/EP2018/067647
§ 371 (c)(1),
(2) Date: Jan. 3, 2020

(87) PCT Pub. No.: WO2019/007848
PCT Pub. Date: Jan. 10, 2019

(65) Prior Publication Data
US 2020/0185791 A1    Jun. 11, 2020

(30) Foreign Application Priority Data

Jul. 6, 2017   (DE) .......................... 102017211506.8

(51) Int. Cl.
*G01R 31/00* (2006.01)
*H01M 10/48* (2006.01)
(Continued)

(52) U.S. Cl.
CPC ............. *H01M 10/48* (2013.01); *B60L 58/12* (2019.02); *B60L 58/16* (2019.02); *G01R 31/367* (2019.01);
(Continued)

(58) Field of Classification Search
USPC ......................................... 324/426, 433–435
See application file for complete search history.

(56) References Cited

U.S. PATENT DOCUMENTS

2009/0206059 A1    8/2009  Kiko
2012/0101674 A1*   4/2012  Wang ................... G01R 31/367
                                                       903/903

(Continued)

FOREIGN PATENT DOCUMENTS

DE    2226332  B1    5/1972
DE    2226 332        12/1973
(Continued)

OTHER PUBLICATIONS

Written Opinion corresponding to German application No. 10 2017 211 506.8 dated Jul. 3, 2018 (10 pages).

(Continued)

*Primary Examiner* — Vincent Q Nguyen
(74) *Attorney, Agent, or Firm* — Maginot, Moore & Beck LLP

(57) ABSTRACT

A method for determining the state of an electric energy storage unit is described. An extension of the electrode assembly and/or a force exerted by the electrode assembly, and at least one electric variable of the electric energy storage unit are detected. A first and a second state variables, which represent the first state of the electric energy storage unit, are ascertained using the detected extension and/or the detected force and also a first mathematical model stored in a data memory and the detected at least one electric variable (Continued)

and also a second mathematical model stored in a data memory. This is followed by carrying out a first comparison of the first state variable with the second state variable. The first and/or the second mathematical model and/or the first and/or the second state variables are/is changed depending on the first comparison.

10 Claims, 5 Drawing Sheets

(51) Int. Cl.
    *G01R 31/392* (2019.01)
    *G01R 31/3842* (2019.01)
    *G01R 31/367* (2019.01)
    *B60L 58/12* (2019.01)
    *B60L 58/16* (2019.01)
    *H01M 10/42* (2006.01)

(52) U.S. Cl.
    CPC ....... *G01R 31/3842* (2019.01); *G01R 31/392* (2019.01); *H01M 10/425* (2013.01); *H01M 10/4285* (2013.01); *H01M 2010/4271* (2013.01)

(56) References Cited

U.S. PATENT DOCUMENTS

| 2015/0188198 | A1 | 7/2015 | Bonhomme et al. | |
| 2017/0365832 | A1* | 12/2017 | Ogata | H01M 10/0525 |
| 2018/0034111 | A1* | 2/2018 | Hinterberger | H01M 10/4257 |

FOREIGN PATENT DOCUMENTS

| DE | 10 2009 028 986 A1 | 3/2011 |
| DE | 102009028986 A1 | 3/2011 |
| DE | 10 2012 209 271 A1 | 12/2013 |
| DE | 102012209271 A1 | 12/2013 |
| EP | 2 848 952 A1 | 3/2015 |
| EP | 2848952 A1 | 3/2015 |
| EP | 2928006 A1 | 7/2015 |

OTHER PUBLICATIONS

International Search Report corresponding to international application No. PCT/EP2018/067647 dated Nov. 6, 2018 (3 pages).
Mohan, Shankar et al., "A Phenomenological Model of Bulk Force in a Li-Ion Battery Pack and Its Application to State of Charge Estimation," Journal of the Electrochemical Society, 161 (14) A2222-A2231 (2014) (20 pages).
A Phenomenological Model of Bulk Force in Li-Ion Battery Pack and Its Application to State of Charge Estimation, Mohan et al., Jornal of Electrochemical Society, 161 (14) A2222-A2231 (2014).

* cited by examiner

METHOD FOR DETERMINING THE STATE OF AN ELECTRICAL ENERGY STORAGE UNIT, CORRESPONDING DEVICE FOR CARRYING OUT THE METHOD AND CORRESPONDING ELECTRICAL ENERGY STORAGE UNIT

This application is a 35 U.S.C. 371 National Stage application of PCT/EP2018/067647, filed Jun. 29, 2018, and claims priority to German Application No. DE102017211506.8, filed on Jul. 6, 2017. The entire contents of the above-mentioned patent applications are incorporated herein by reference as part of the disclosure of this U.S. application.

The present invention is based on a method for determining the state of an electric energy storage unit, a device configured for carrying out the method, and an electric energy storage unit comprising the device.

PRIOR ART

Electric energy storage units, in particular based on lithium ion technology, precisely in the automotive sector, are becoming increasingly prevalent as an important component in the drivetrain. In this case, the electrodes of an electric energy storage unit are subjected to volumetric changes on account of the processes of storing and releasing the lithium ions. Depending on a state of charge, but also aging of the electrodes, the corresponding extension of the electrodes changes, in particular orthogonally with respect to a layer arrangement of the electrodes. These mechanical changes can accordingly be used in addition to the measurement variables already used hitherto, temperature, electric voltage of an electric energy storage unit or an electric current, in order to increase the accuracy with which the aging or the state of charge of an electrode is determined or in order to minimize inaccuracies based on solely detecting electric variables.

The document DE 10 2012 209 271 A1 describes a battery management system of a battery, wherein a pressure-sensitive film sensor is fitted on an electrode winding within a battery cell, the measurement values of said sensor being evaluated by a battery state identification facility and being used for battery state identification.

The document US 2015/0188198 A1 describes a battery module having a battery cell and also a force gauge and a control module, wherein the force gauge measures a force on account of the swelling of the battery cell and the control module is configured to estimate the remaining life of the battery module on the basis of the force measurement data received.

In the article "A phenomenological Model of Bulk Force in a Li-Ion Battery Pack and its Application to State of Charge Estimation" by Shankar Mohan et al., Journal of the Electrochemical Society, 161 (14) A2222-A2231 (2014), the force developed by a lithium-ion cell during charging and discharging, respectively, is described by means of a mathematical model. A description is given here of an experimental set-up that provides force measuring units outside a battery cell.

BRIEF SUMMARY OF THE INVENTION

A method for determining the state of an electric energy storage unit, a device configured for carrying out the method, and an electric energy storage unit comprising the device having the features of the independent patent claims are disclosed.

In this case, the electric energy storage unit has at least two pole connections and at least one electrode assembly.

Within the method, an extension of the electrode assembly and/or a force exerted by the electrode assembly are/is detected.

Furthermore, a first state variable, which represents a first state of the electric energy storage unit, is ascertained, wherein the detected extension of the electrode assembly and/or the force exerted by the electrode assembly and also a first mathematical model stored in a data memory are used for this purpose. In particular, the first state variable can represent a state of charge or a state of health of the electric energy storage unit. The state of health can be a dimensionless value, for example, which decreases as the force exerted by the electrode assembly rises and/or as the extension increases. The first mathematical model can be stored for example in a memory component of a battery management controller. A mathematical model can comprise differential equations or algebra equations, for example. Furthermore, a data-based family of characteristic curves can also be part of the mathematical model. For this purpose, by way of example, a plurality of extension and/or force values can be linked with the corresponding state of charge values and stored in the memory component. A model in the form: state of charge=$a*1$ is also conceivable, wherein a is a model constant and 1 is the extension.

Furthermore, at least one electric variable of the electric energy storage unit is detected, wherein the electric variable can represent in particular a current flowing in the electric energy storage unit and/or an electric voltage prevailing between the pole connections.

Furthermore, a second state variable, which likewise represents the first state of the electric energy storage unit, is ascertained using the detected at least one electric variable of the electric energy storage unit and also a second mathematical model likewise stored in a data memory. The first state is thus ascertained by means of two different state variables.

Afterward, a first comparison of the first state variable with the second state variable is carried out.

This is then followed optionally by changing the first mathematical model and/or variables ascertained by means of the first mathematical model depending on the first comparison. Alternatively or additionally, this is followed by changing the second mathematical model and/or variables ascertained by means of the second mathematical model depending on the first comparison.

This advantageously makes use of the fact that a first state was ascertained by means of two different state variables. As a result, deviations between the ascertaining methods can be established and at the same time the corresponding mathematical models used and/or the variables ascertained thereby can be adapted. This increases the accuracy of the state determination and thus provides for an improved utilization of the energy content of the electric energy storage unit. Furthermore, by way of example, forecasts of the life of the electric energy storage unit can be effected more accurately and unnecessary failures of the electric energy storage unit can thus be prevented. It is also possible for the electric energy storage unit to be operated in a manner that prolongs the life of the electric energy storage unit since limit value for voltages and/or currents are complied with better for example as a result of the more accurate state determination.

The dependent claims relate to further advantageous embodiments of the present invention.

It is expedient practice to ascertain a correction factor for changing the first mathematical model and/or the second mathematical model and/or the variables ascertained by means of the first mathematical model and/or the variables ascertained by means of the second mathematical model. The corresponding variables and/or models can thus advantageously be corrected, wherein for example a temperature of the electric energy storage unit can additionally be taken into account by means of the correction factor.

It is expedient practice to carry out a second comparison of the detected extension of the electrode assembly with a predefined extension threshold value and/or of the force exerted by the electrode assembly with a predefined force threshold value. Afterward, depending on the second comparison, a first signal for indicating the result of the comparison is generated. The first signal can switch on an illuminant, for example, which indicates to a user that the corresponding threshold value is exceeded. This is advantageous since the user is thereby notified of a possibly dangerous situation and can thus optionally take direct action, which reduces the risk to life and limb.

It is expedient practice to ascertain a difference value between the first state variable and the second state variable and then to ascertain the correction factor depending on the difference value. This has the advantage that known control engineering structures, for example a Kalman filter, which utilize the difference value can be used in order mathematically to estimate the first state.

It is expedient practice to effect the detection of the extension and/or of the exerted force on mutually opposite sides of the electric energy storage unit and/or the electrode assembly. The sensitivity of the method is increased as a result since the corresponding extension and/or the corresponding force act(s) on both sides in the case of shapes of electric energy storage units, in particular battery cells, that are prismatic or cylindrical or generally have a symmetry. Advantageously, the detection of the extension and/or of the exerted force is effected at the same location on the opposite sides of the electric energy storage unit in order to ensure as identical measurement conditions as possible and to yield comparable measurement results.

Expediently, the detection of the extension and/or of the exerted force is effected within the electric energy storage unit. Consequently, the corresponding measurement values are not corrupted by external influences, which increases the accuracy of the method.

Expediently, the detection of the extension of the electrode assembly is effected by means of at least one strain gauge. Alternatively or additionally, the force exerted by the electrode assembly is detected by means of at least one piezoelement and/or by means of at least one induction coil. This has the advantage that force and/or extension measurement methods that are proven and have been tried and tested in practice are used, which ensures simple implementability.

Furthermore, the disclosure relates to a device comprising at least one means which is configured to perform the method mentioned above. The advantages mentioned above can thus be realized. The at least one means can comprise for example a battery management controller and optionally current sensors and/or voltage sensors and/or temperature sensors. An electronic control unit, in particular manifested as a battery management controller, can also be such a means. An electronic control unit can be understood to mean, in particular, an electronic controller comprising for example a microcontroller and/or an application-specific hardware component, e.g. an ASIC, but can likewise encompass a personal computer or a programmable logic controller.

Furthermore, the disclosure relates to an electric energy storage unit comprising at least two pole connections and an electrode assembly and also the device mentioned above. The advantages mentioned above can thus be realized.

An electric energy storage unit can be understood to mean, in particular, an electrochemical battery cell and/or a battery module having at least one electrochemical battery cell and/or a battery pack having at least one battery module. For example, the electric energy storage unit can be a lithium-based battery cell or a lithium-based battery module or a lithium-based battery pack. In particular, the electric energy storage unit can be a lithium-ion battery cell or a lithium-ion battery module or a lithium-ion battery pack. Furthermore, the battery cell can be of the following type: lithium-polymer rechargeable battery, nickel-metal hydride rechargeable battery, lead-acid rechargeable battery, lithium-air rechargeable battery or lithium-sulfur rechargeable battery or very generally a rechargeable battery of any desired electrochemical composition. A capacitor, too, is possible as electric energy storage unit.

Expediently, the electric energy storage unit comprises at least two means for detecting an extension of the electrode assembly and/or a force exerted by the electrode assembly, said at least two means being situated on opposite sides of the electric energy storage unit or the electrode assembly.

BRIEF DESCRIPTION OF THE DRAWINGS

Advantageous embodiments of the invention are illustrated in the figures and are explained in greater detail in the following description.

In the figures.

DETAILED DESCRIPTION OF THE INVENTION

In all figures, identical reference signs designate identical device components or identical method steps.

Figure 1:
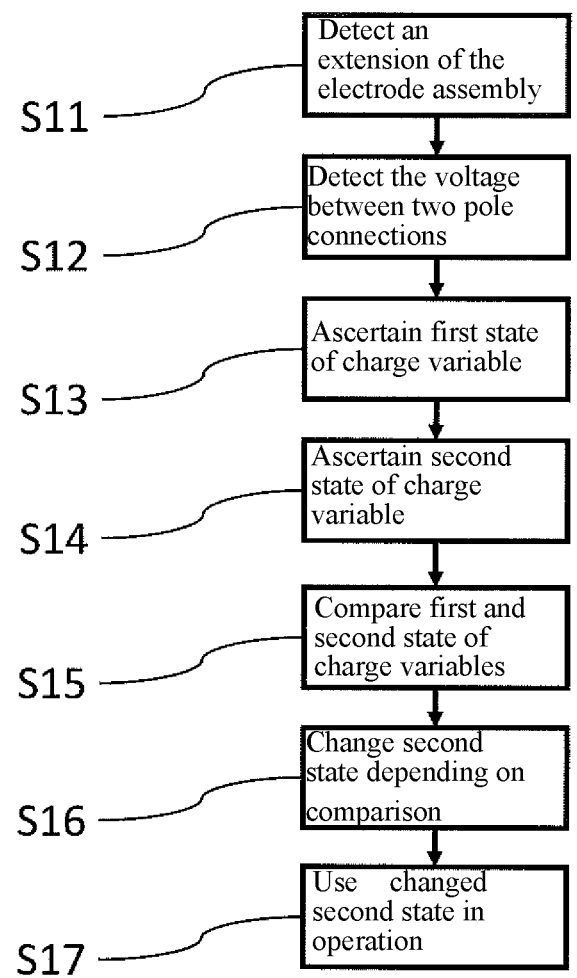
FIG. 1 shows a flow diagram of the disclosed method in accordance with a first embodiment.

FIG. 1 shows a flow diagram of the disclosed method for determining the state of an electric energy storage unit in accordance with a first embodiment. In this case, the electric energy storage unit whose state is being determined comprises at least two pole connections and an electrode assembly. A first step S11 involves detecting an extension of the electrode assembly. Afterward, a second step S12 involves detecting the electric voltage prevailing between the two pole connections of the electric energy storage unit. Afterward, a third step S13 involves ascertaining a first state of charge variable, which represents the state of charge of the electric energy storage unit, using the detected extension of the electrode assembly and a first mathematical model stored in a data memory. Furthermore, a fourth step S14 involves ascertaining a second state of charge variable, which, just like the first state of charge variable, represents the state of charge of the electric energy storage unit, using the detected electric voltage and also a second mathematical model stored in a data memory. This can be effected for example by means of an electric equivalent circuit diagram model of the electric energy storage unit and a control engineering structure, for example a Kalman filter. A fifth step S15 then involves carrying out a first comparison of the first state of charge variable with the second state of charge variable. Assuming that the first state of charge variable and the second state of charge variable differ by more than a predefined magnitude, the second state of charge variable, in a sixth step S16, is changed depending on the result of the comparison and, in a seventh step S17, is used during operation of the electric energy storage unit in order to increase the life of the electric energy storage unit as a result of the more accurate state determination. If the first state of charge variable and the second state of charge variable do not differ by more than the predefined magnitude, no change is necessary. In that case, it is possible for example to commence again at the first step S11 and the method begins anew.

Figure 2:
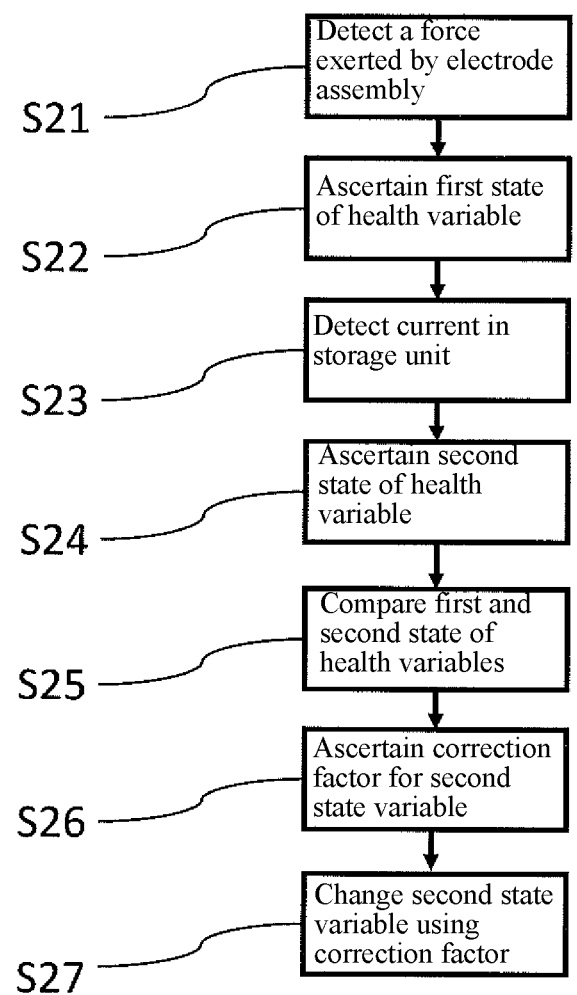
FIG. 2 shows a flow diagram of the disclosed method in accordance with a second embodiment.

FIG. 2 shows a flow diagram of the disclosed method for determining the state of an electric energy storage unit in accordance with a second embodiment. In this case, the electric energy storage unit whose state is being determined comprises at least two pole connections and an electrode assembly. A first step S21 involves detecting a force exerted by the electrode assembly. A second step S22 involves ascertaining a first state of health variable using the detected force exerted and also a first mathematical model stored in a data memory. The first state of health variable can be a dimensionless value, for example, which decreases as the force exerted by the electrode assembly rises. Exemplary numerical values range between 0 and 1 or between 0% and 100% and can be read from a family of characteristic curves, for example, in which individual extension values are assigned a respective value of the first state of health variable. These relations can be obtained from experiments, for example. Afterward, a third step S23 involves detecting the current flowing in the electric energy storage unit and the electric voltage prevailing between the pole connections. A fourth step S24 then involves ascertaining a second state of health variable using the detected electric current and the detected electric voltage and also a second mathematical model stored in a data memory. In this case, the second state of health variable, just like the first state of health variable, represents the state of health of the electric energy storage unit. In this case, the second state of health variable can be a dimensionless value, for example, which likewise decreases as the electric storage capacity of the electric energy storage unit decreases. Afterward, a fifth step S25 involves comparing the first state of health variable with the second state of health variable. Afterward, a sixth step S26 involves ascertaining a correction factor for changing the second state of health variable, said correction factor being based for example on the difference between the first state variable and the second state variable. An exemplary definition of the correction factor reads: correction factor=C* (value of the first state variable minus value of the second state variable), wherein C is a corresponding constant. Afterward, a seventh step S27 involves changing the second state of health variable depending on the first comparison and using the correction factor.

Figure 3:
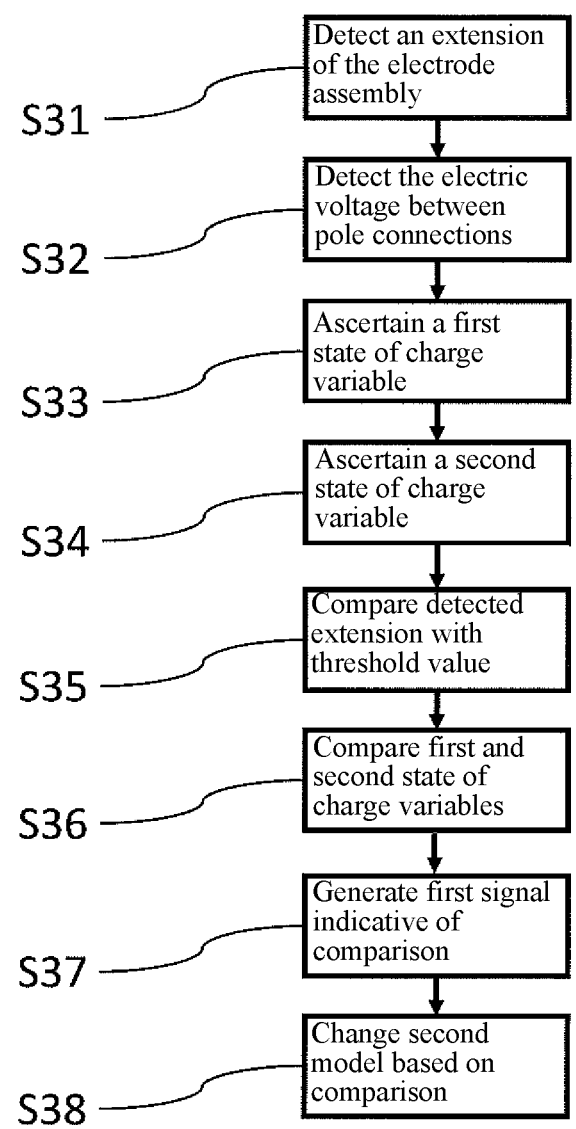
FIG. 3 shows a flow diagram of the disclosed method in accordance with a third embodiment.

FIG. 3 shows a flow diagram of the disclosed method for determining the state of an electric energy storage unit in accordance with a third embodiment. A first step S31 involves detecting an extension of the electrode assembly. Afterward, a second step S32 involves detecting the electric voltage prevailing between the two pole connections of the electric energy storage unit. Afterward, a third step S33 involves ascertaining a first state of charge variable, which represents the state of charge of the electric energy storage unit, using the detected extension of the electrode assembly and a first mathematical model stored in a data memory. Furthermore, a fourth step S34 involves ascertaining a second state of charge variable, which, just like the first state of charge variable, represents the state of charge of the electric energy storage unit, using the detected electric voltage and also a second mathematical model stored in a data memory. Afterward, a fifth step S35 involves carrying out a first comparison of the detected extension of the electrode assembly with a predefined extension threshold value. Furthermore, a sixth step S36 involves comparing the first state variable with the second state variable. Assuming that the extension threshold value is exceeded, a seventh step S37 involves generating a first signal for indicating the first comparison result. Afterward, an eighth step S38 involves changing the second mathematical model depending on the comparison of the first state variable with the second state variable, for example by changing the parameter values of the second mathematical model. Furthermore, the second state variable is changed depending on the comparison of the first state variable with the second state variable, for example by a value of the second state variable being increased or reduced depending on the comparison, and is used for forecasting the life of the electric energy storage unit.

Figure 4:
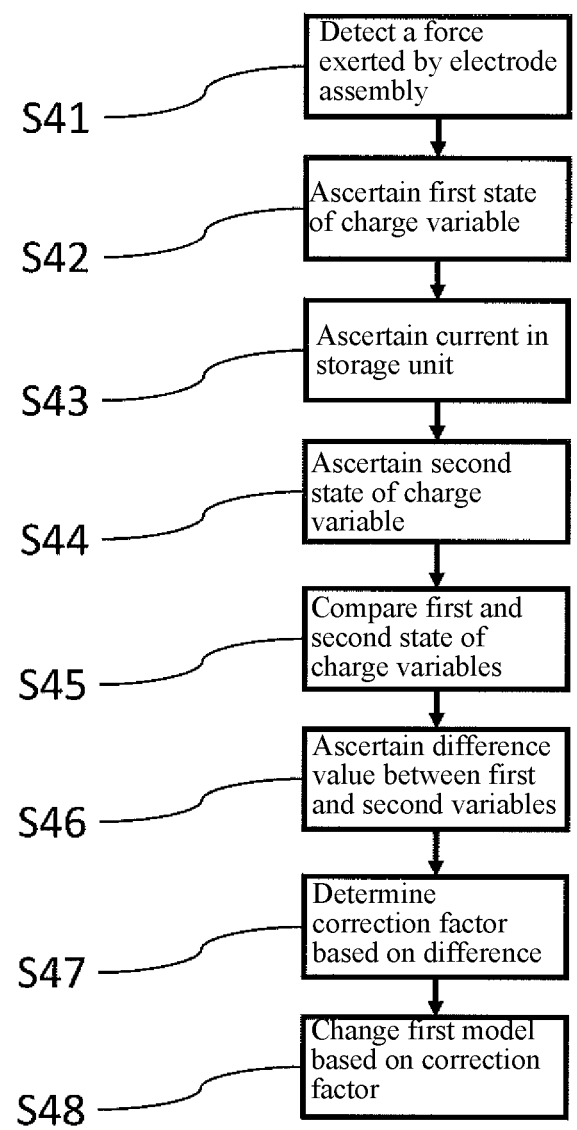
FIG. 4 shows a flow diagram of the disclosed method in accordance with a fourth embodiment.

FIG. 4 shows a flow diagram of the disclosed method for determining the state of an electric energy storage unit in accordance with a fourth embodiment. In this case, the electric energy storage unit whose state is being determined comprises at least two pole connections and an electrode assembly. A first step S41 involves detecting a force exerted by the electrode assembly. Afterward, a second step S42 involves ascertaining a first state of charge variable using the detected force exerted and also a first mathematical model stored in a data memory. Afterward, a third step S43 involves ascertaining the current flowing in the electric energy storage unit and the electric voltage prevailing between the pole connections. A fourth step S44 involves ascertaining a second state of charge variable using the detected electric current and the detected electric voltage and also a second mathematical model stored in a data memory. Afterward, a fifth step S45 involves carrying out a first comparison of the first state variable with the second state variable. Afterward, a sixth step S46 involves ascertaining a difference value between the first state variable and the second state variable. Subsequently, a seventh step S47 involves determining a correction factor depending on the difference value ascertained. An eighth step S48 involves changing the first mathematical model depending on the first comparison and the correction factor ascertained. Afterward, the changed mathematical model can be used for example in the context of more accurately ascertaining the remaining life of the electric energy storage unit.

Figure 5:
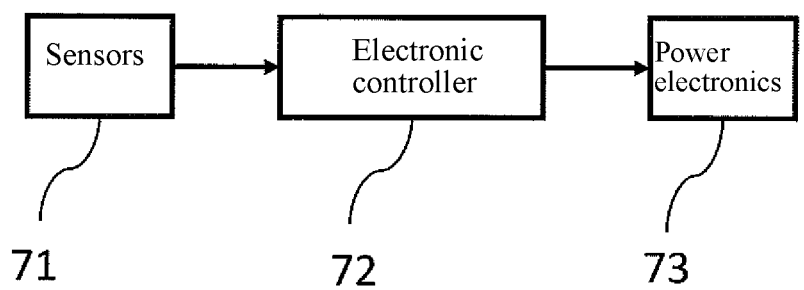
FIG. 5 shows a schematic illustration of the device configured to perform the disclosed method.

FIG. 5 shows a schematic illustration of the disclosed device 70 configured to perform the disclosed method. In this case, an extension of an electrode assembly and/or a force exerted by the electrode assembly and also an electric current and an electric voltage of an electric energy storage unit are detected by means of suitable sensors 71, for example by means of a strain gauge and/or a piezoelement and a current and respectively voltage sensor. The detected values are processed in an electronic controller 72 in accordance with the method steps described above and the corresponding variables described are ascertained. Furthermore, corresponding control variables, for example current and voltage setpoint values, can be calculated and output to power electronics 73 in order for example to prolong the life of the electric energy storage unit or to enable the electric energy storage unit to be operated more gently.

The invention claimed is:

1. A method for determining the state of an electric energy storage unit, wherein the electric energy storage unit has at least two pole connections and at least one electrode assembly, comprising the following steps:
   a) detecting at least one of an extension of the electrode assembly and a force exerted by the electrode assembly;
   b) ascertaining a first state variable, which represents a first state of the electric energy storage unit, said first state representative of one of a state of charge or a state of health, using one or both of the detected extension of the electrode assembly and the detected force exerted by the electrode assembly and a first mathematical model stored in a data memory;
   c) detecting at least one electric variable of the electric energy storage unit, the at least one electric variable including one or both of a current flowing in the electric energy storage unit and an electric voltage prevailing between the pole connections;
   d) ascertaining a second state variable, which represents the first state of the electric energy storage unit, using the detected at least one electric variable of the electric energy storage unit and a second mathematical model stored in a data memory;
   e) carrying out a first comparison of the first state variable with the second state variable;
   f) changing one or more of the first mathematical model and the ascertained first state variable, depending on the first comparison, and/or changing one or more of the second mathematical model and the ascertained second state variable, depending on the first comparison.

2. The method as claimed in claim 1, further comprising:
   g) ascertaining a correction factor for changing the first and/or the second mathematical model and/or the ascertained first and/or the ascertained second state variables.

3. The method as claimed in claim 2, further comprising:
   j) ascertaining a difference value between the first state variable and the second state variable;
   k) ascertaining the correction factor depending on the difference value.

4. The method as claimed in claim 1, further comprising:
   h) carrying out a second comparison of one or both of the detected extension of the electrode assembly with a predefined extension threshold value and of the force exerted by the electrode assembly with a predefined force threshold value;
   i) depending on the second comparison, generating a first signal for indicating the result of the comparison.

5. The method as claimed in claim 1, wherein the detection of the extension and/or of the exerted force in step a) is effected on mutually opposite sides of the electric energy storage unit and/or the electrode assembly.

6. The method as claimed in claim 1, wherein the detection of the extension and/or of the exerted force in step a) is effected within the electric energy storage unit.

7. The method as claimed in claim 1, wherein the detection of the extension of the electrode assembly is effected by means of at least one strain gauge and/or the force exerted by the electrode assembly is detected by means of at least one piezoelement and/or by means of at least one induction coil.

8. A device, comprising at least one electronic battery management controller which is configured to perform the steps of the method as claimed in claim 1.

9. An electric energy storage unit, comprising at least two pole connections, an electrode assembly and a device as claimed in claim 8.

10. The electric energy storage unit as claimed in claim 9, further comprising at least two means for detecting an extension of the electrode assembly and/or a force exerted by the electrode assembly, said at least two means being situated on opposite sides of the electric energy storage unit and/or the electrode assembly.

* * * * *